United States Patent
Hsieh

(10) Patent No.: US 7,939,919 B2
(45) Date of Patent: May 10, 2011

(54) LED-PACKAGING ARRANGEMENT AND LIGHT BAR EMPLOYING THE SAME

(75) Inventor: Chia-Han Hsieh, Taoyuan Hsien (TW)

(73) Assignee: Lumenmax Optoelectronics Co., Ltd., Taoyuan Hsien (TW)

( * ) Notice: Subject to any disclaimer, the term of this patent is extended or adjusted under 35 U.S.C. 154(b) by 0 days.

(21) Appl. No.: 12/453,943

(22) Filed: May 28, 2009

(65) Prior Publication Data

US 2010/0001298 A1    Jan. 7, 2010

(30) Foreign Application Priority Data

Jul. 3, 2008 (TW) ................................ 97125009 A
Feb. 18, 2009 (TW) ................................ 98105067 A

(51) Int. Cl.
*H01L 33/64* (2010.01)

(52) U.S. Cl. ........ 257/675; 257/712; 257/717; 257/713; 257/720; 257/E23.051; 257/E23.08; 257/E23.101; 257/88; 257/99

(58) Field of Classification Search ................ None
See application file for complete search history.

(56) References Cited

U.S. PATENT DOCUMENTS

| 7,208,772 | B2 * | 4/2007 | Lee et al. | 257/99 |
| 2006/0091410 | A1 * | 5/2006 | Chen | 257/95 |
| 2007/0126020 | A1 * | 6/2007 | Lin et al. | 257/100 |
| 2008/0258162 | A1 * | 10/2008 | Koung et al. | 257/98 |

* cited by examiner

*Primary Examiner* — Minh-Loan T Tran
*Assistant Examiner* — Fei Fei Yeung Lopez
(74) *Attorney, Agent, or Firm* — Rosenberg, Klein & Lee

(57) ABSTRACT

An LED-packaging arrangement, comprising: a first connection block with an enclosure groove at the bottom thereof; a second connection block with an enclosure groove at the bottom thereof; a light-emitting chip positioned at the top of the first connection block and via connection wires electrically coupled to the first and second connection blocks; a positioning/packaging body, and a transparent packaging body. Alternatively, a third connection block is provided with an enclosure groove at the bottom thereof. In this case, the electrical connection originally to the first connection block via the connection wire is changed to the third connection block. The first and second connection blocks are enclosed by the lower part of the positioning/packaging body in position such that the bottom surfaces of the first and second connection blocks are exposed. The upper part of the positioning/packaging body encloses the light-emitting chip so as to create a reflection cap. The transparent packaging body is employed to seal and fix the light-emitting chip and the connection wires in position for an optimal protection. In this way, the problem of the prior art is resolved that the heat generated by the light-emitting chip is not easily dissipated. Moreover, the heat-dissipating efficiency and the structural strength can be considerably enhanced.

10 Claims, 4 Drawing Sheets

US 7,939,919 B2

LED-PACKAGING ARRANGEMENT AND LIGHT BAR EMPLOYING THE SAME

BACKGROUND OF THE INVENTION

1. Field of the Invention

The invention relates to an LED-packaging arrangement, and more particularly to a structure employing a positioning/packaging body whose upper part serves as a reflection cap while the lower part thereof encloses a first, a second, and a third connection block in position. In addition, the bottom surfaces of the first, second, and third connection blocks are exposed.

2. Description of the Related Art

The light-emitting diodes (LED) have the features of "high degree of delicacy," "high brightness", "mercury-free", "high color-rendering" and so on. Moreover, the LED brightness is unceasingly improved. Due to the prosperous lighting market, the application of LEDs is much diversified. They can be applied to indicating lamps, traffic lights, backlights of mobile phones and liquid crystal displays, and automobile lamps. Moreover, the LEDs fulfill the requirements of environmental protection with mercury-free use. However, a large part of energy will be converted into heat during the conversion of the electrical energy into light by LEDs. The heat generated during the light-emitting process is not removed, thereby shorten the service life of LEDs. Moreover, the light-conversion efficiency and the color-rendering effect will be affected. Therefore, the heat-dissipation efficiency is often the most critical point to be overcome in the development of LED-packaging technology.

As shown in FIG. 1, a conventional LED-packaging arrangement includes a first and a second ⊂-shaped connection piece 12, 13 mounted at both sides of a substrate 11. A light-emitting chip 14 is placed at the rim of the first ⊂-shaped connection piece 12 and via connection wires 15 coupled to the first and second ⊂-shaped connection pieces 12, 13. Besides, a reflection cap 16 is formed around the light-emitting chip 14. Thereafter, a transparent packaging body 17 is employed to seal and fix the light-emitting chip 14 and the connection wires 15 in position for an optimal protection. In addition to the electrical connection, the first ⊂-shaped connection piece 12 of the above-mentioned LED-packaging arrangement also has the function of dissipation of heat generated by the light-emitting chip 14 during the light-emitting process. However, there is a long heat-dissipation path (from the heat-absorption top via the side rim to the bottom for heat-dissipation), as shown by arrows in FIG. 1. Moreover, the heat transfer area is very small. Thus, it is not easy to dissipate the heat generated during the light-emitting process of the light-emitting chip 14.

SUMMARY OF THE INVENTION

An object of the invention is to eliminate the above-mentioned drawbacks and to provide an LED-packaging arrangement with which the heat-dissipating efficiency is considerably enhanced.

Another object of the invention is to provide an LED-packaging arrangement with which the structural strength is increased.

In order to achieve the above-mentioned objects, an LED-packaging arrangement according to a first embodiment of the invention includes:

a) a first connection block;

b) a second connection block;

c) a light-emitting chip positioned at the top of the first connection block and via connection wires electrically coupled to the first and second connection blocks;

d) a positioning/packaging body adapted to enclose the first and second connection blocks in position by the lower part thereof such that the bottom surfaces of the first and second connection blocks are exposed, the upper part of the positioning/packaging body enclosing the light-emitting chip so as to create a reflection cap; and e) a transparent packaging body adapted to seal and fix the light-emitting chip and the connection wires in position for an optimal protection.

An LED light bar employing the above-mentioned structural features according to the first embodiment of the invention includes a plurality of LED-packaging arrangements on the surface of a circuit board. The circuit board includes an isolation carrier plate with circuits at the top thereof. The created circuits are arranged corresponding to the first connection blocks and the second connection blocks of the LED-packaging arrangement in such a way that a plurality of first connection pads and second connection pads not covered by a solder mask are created in an exposed state. Besides, a plurality of heat-dissipating pads not covered by the solder mask are formed at the bottom of the isolation carrier plate. The surface of the heat-dissipating pad includes a heat-conducting isolation layer. Furthermore, a heat-conducting through hole is formed between the first connection pad and the corresponding heat-dissipating pad for a thermal connection.

According to a second embodiment of the invention, an LED-packaging arrangement includes:

a) a first connection block;

b) a second connection block;

c) a third connection block;

d) a light-emitting chip positioned at the top of the first connection block and via connection wires electrically coupled to the second and third connection blocks;

e) a positioning/packaging body adapted to enclose the first, second, and third connection blocks in position by the lower part thereof such that the bottom surfaces of the first and second connection blocks are exposed, the upper part of the positioning/packaging body enclosing the light-emitting chip so as to create a reflection cap; and f) a transparent packaging body adapted to seal and fix the light-emitting chip and the connection wires in position for an optimal protection.

An LED light bar employing the above-mentioned structural features according to the second embodiment of the invention includes a plurality of LED-packaging arrangements on the surface of a circuit board. The circuit board includes an isolation carrier plate with circuits at the top thereof. The created circuits are arranged corresponding to the third connection blocks and the second connection blocks of the LED-packaging arrangement in such a way that a plurality of first connection pads and second connection pads not covered by a solder mask are created in an exposed state. Besides, a plurality of heat-dissipating pads are formed at the bottom of the isolation carrier plate. The surface of the heat-dissipating pad includes a heat-conducting isolation layer. Furthermore, a heat-conducting through hole is formed between the first connection pad of the LED-packaging arrangement and the corresponding heat-dissipating pad for a thermal connection.

BRIEF DESCRIPTION OF THE DRAWINGS

The accomplishment of this and other objects of the invention will become apparent from the following descriptions and its accompanying figures of which.

DETAILED DESCRIPTION OF THE PREFERRED EMBODIMENT

Figure 1:
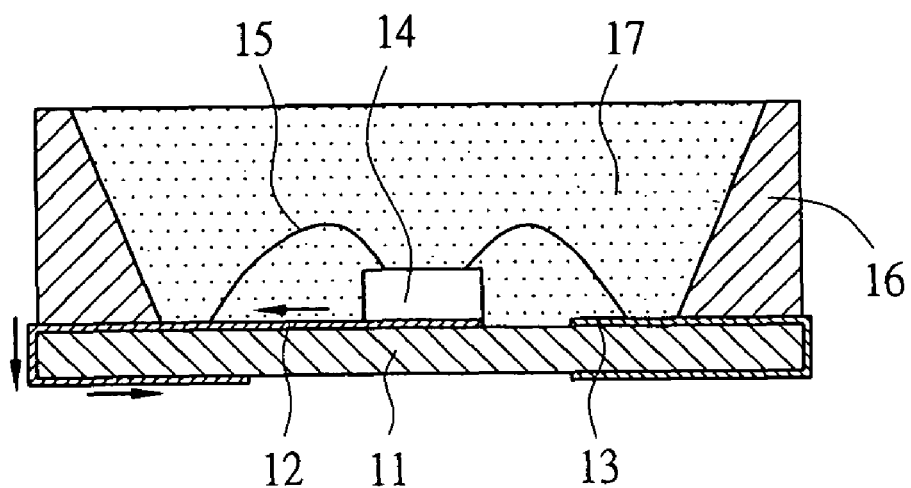
FIG. 1 is a cutaway view of a conventional LED-packaging arrangement.
Figure 3:
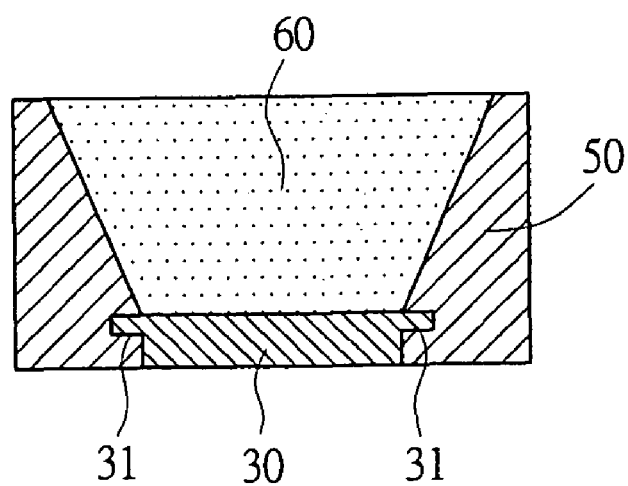
FIG. 3 is a cross-sectional view taken along the line 3-3 in FIGS. 2A and 2B.
Figure 2A:
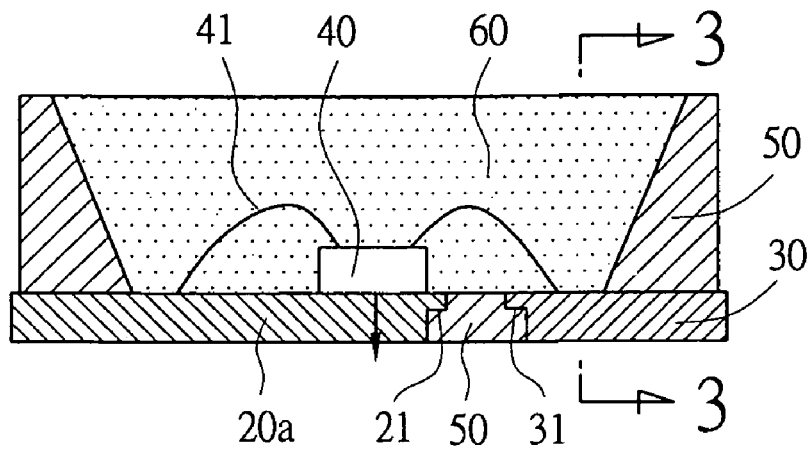
FIG. 2A is a cutaway view of a first embodiment of a LED-packaging arrangement of the invention.

First of all, referring to FIGS. 2A and 3, an embodiment of an LED-packaging arrangement in accordance with the invention includes a first connection block 20a with an enclosure groove 21 at the bottom thereof, a second connection block 30 with an enclosure groove 31 at the bottom thereof, a light-emitting chip 40, a positioning/packaging body 50, and a transparent packaging body 60. The light-emitting chip 40 is positioned at the top of the first connection block 20a and via connection wires 41 electrically coupled to the first and second connection blocks 20a, 30. The first and second connection blocks 20a, 30 are enclosed by the lower part of the positioning/packaging body 50 in position such that the bottom surfaces of the first and second connection blocks 20a, 30 are exposed. The upper part of the positioning/packaging body 50 encloses the light-emitting chip 40 so as to create a reflection cap. The transparent packaging body 60 is employed to seal and fix the light-emitting chip 40 and the connection wires 41 in position for an optimal protection.

Figure 2B:
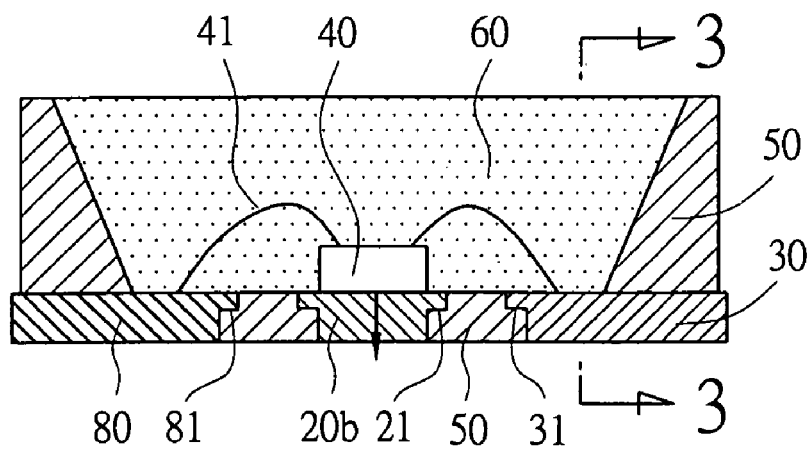
FIG. 2B is a cutaway view of a second embodiment of a LED-packaging arrangement of the invention.

In order to achieve an excellent transfer distribution of the thermal and electric energy so as to protect the application terminal from an electric short circuit, a second embodiment of the LED-packaging arrangement in accordance with the invention, as shown in FIGS. 2B and 3; includes a first connection block 20b with an enclosure groove 21 at the bottom thereof, a second connection block 30 with an enclosure groove 31 at the bottom thereof, a third connection block 80 with an enclosure groove 81 at the bottom thereof, a light-emitting chip 40, a positioning/packaging body 50, and a transparent packaging body 60. The light-emitting chip 40 is positioned at the top of the first connection block 20b and via connection wires 41 electrically coupled to the first and second connection blocks 30, 80. The first, second, and third connection blocks 20a, 30, 80 are enclosed by the lower part of the positioning/packaging body 50 in position such that the bottom surfaces of the first, second, and third connection blocks 20b, 30, 80 are exposed. The upper part of the positioning/packaging body 50 encloses the light-emitting chip 40 so as to create a reflection cap. The transparent packaging body 60 is employed to seal and fix the light-emitting chip 40 and the connection wires 41 in position for an optimal protection.

Based upon the above-mentioned structure, the light-emitting heat energy of the light-emitting chip 40 can be downwardly transmitted by the first connection block 20a (or 20b), as shown by the arrow in the drawing. In the way, a short heat dissipation path and a large heat transfer area are achieved. As a result, the light-emitting heat energy of the light-emitting chip 40 can be rapidly removed. Meanwhile, the light conversion efficiency and the operation power may be enhanced. Moreover, the service life can be extended. In addition, the first, second, and third connection blocks 20a (or 20b), 30, 80 are enclosed by the positioning/packaging body 50 in position. Meanwhile, the enclosure grooves 21, 31, 81 enhance the enclosure grade. Consequently, the structural strength of the entire body is increased.

According to the LED-packaging arrangement of the invention, the lower part of the positioning/packaging body 50 is employed to enclose the first, second, and third connection blocks 20a (or 20b), 30, 80 in position such that the bottom surfaces of the first, second, and third connection blocks 20a (or 20b), 30, 80 are exposed. In this way, a short heat dissipation path with a large heat transfer area is created for the light-emitting chip 40 at the top of the first connection block 20a (or 20b). As a result, the light-emitting heat energy of the light-emitting chip 40 can be rapidly removed. Meanwhile, the structural strength of the entire body is increased. In other words, the heat-dissipating efficiency and the structural strength can be considerably enhanced.

Figure 4A:
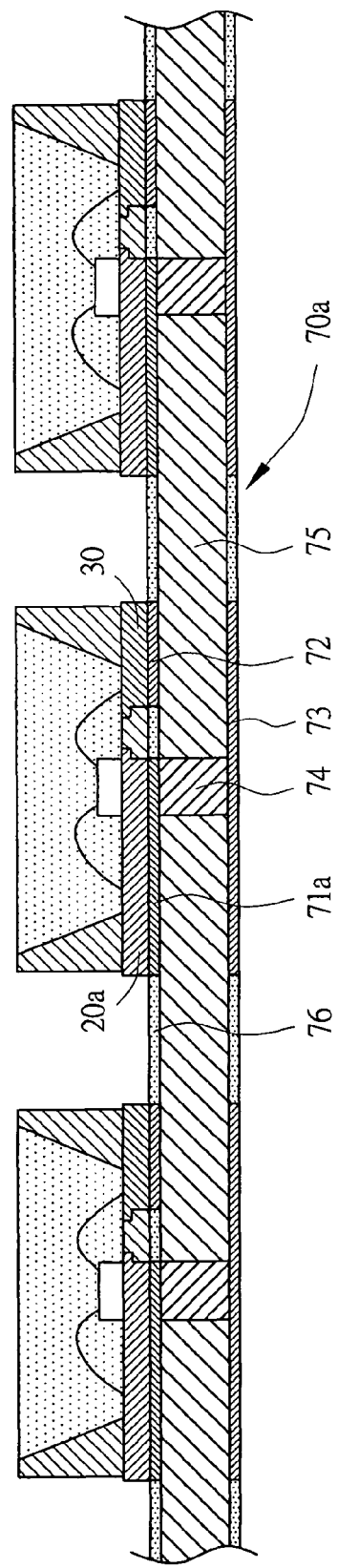
FIG. 4A is a cutaway view of a first embodiment of a LED light bar of the invention.

However, the heat-dissipating efficiency still leaves much to be desired when the above-mentioned LED-packaging arrangement with a considerably enhanced heat-dissipating efficiency is applied to a circuit board with a heat-dissipating arrangement for manufacturing a light bar. A first embodiment of the LED light bar of the invention is shown in FIG. 4A. A circuit board 70a is fitted with a plurality of the LED-packaging arrangements according the above-mentioned first embodiment.

The circuit board 70a includes an isolation carrier plate 75 with circuits at the top thereof. The created circuits are arranged corresponding to the first connection blocks 20a and the second connection blocks 30 of the LED-packaging arrangement in such a way that a plurality of first connection pads 71a and second connection pads 72 not covered by a solder mask 76 are created in an exposed state. Besides, a plurality of heat-dissipating pads 73 not covered by the solder mask 76 are formed at the bottom of the isolation carrier plate 75. A heat-conducting through hole 74 is formed between the first connection pad 71a and the heat-dissipating pad 73 for a thermal connection.

Figure 4B:
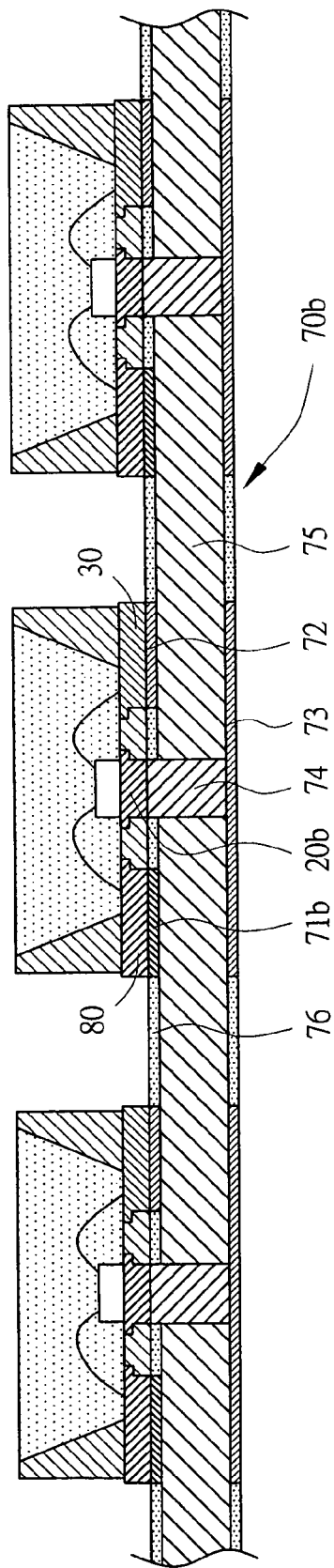
FIG. 4B is a cutaway view of a second embodiment of a LED light bar of the invention.

A second embodiment of the LED light bar of the invention is shown in FIG. 4B. A circuit board 70b is fitted with a plurality of the LED-packaging arrangements according the above-mentioned second embodiment.

The circuit board 70b includes an isolation carrier plate 75 with circuits at the top thereof. The created circuits are arranged corresponding to the third connection blocks 80 and the second connection blocks 30 of the LED-packaging arrangement in such a way that a plurality of first connection pads 71b and second connection pads 72 not covered by the solder mask 76 are created in an exposed state. Besides, a plurality of heat-dissipating pads 73 not covered by the solder mask 76 are formed at the bottom of the isolation carrier plate 75. A heat-conducting through hole 74 is formed between the first connection block 20b and the heat-dissipating pad 73 for a thermal connection.

Thus, the light-emitting heat energy of the light-emitting chip 40 can be downwardly transmitted through the first connection block 20a (or 20b), the first connection pad 71a and the heat-conducting through hole 74 to the heat-dissipating pad 73 of the circuit board 70a (or directly through the heat-conducting through hole 74 of the circuit board 70a and the heat-dissipating pads 73). In the way, a short heat dissipation path and a large heat transfer area are achieved. As a result, the light-emitting heat energy of the light-emitting chip 40 can be rapidly transmitted to the external structure for mounting the circuit board 70a (or 70b). Meanwhile, a heat-conducting isolation layer (not shown) is formed on the surface of the heat-dissipating pad 73 before the circuit board 70a (or 70b) is attached to the external structure. The heat-conducting isolation layer is made by heat-conducting isolation adhesive.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. An LED light bar having a plurality of LED-packaging arrangements on a circuit board,
    wherein the LED-packaging arrangements include:
        a) a first connection block;
        b) a second connection block;
        c) a light-emitting chip positioned at the top of the first connection block and via connection wires electrically coupled to the first and second connection blocks;
        d) a positioning/packaging body adapted to enclose the first and second connection blocks in position such that the bottom surfaces of the first and second connection blocks are exposed; and
        e) a transparent packaging body adapted to seal and fix the light-emitting chip and the connection wires in position for an optimal protection, and
    wherein the circuit board includes an isolation carrier plate with circuits at the top thereof, and wherein the circuits are arranged corresponding to the first connection blocks and the second connection blocks of the LED-packaging arrangements in such a way that a plurality of first connection pads and second connection pads are created, and wherein a plurality of heat-dissipating pads are formed at the bottom of the isolation carrier plate, and wherein a heat-conducting through hole is formed between corresponding ones of the first connection pads and heat-dissipating pads for a thermal connection.

2. The LED light bar as recited in claim 1 wherein the first and second connection blocks are enclosed by the lower part of the positioning/packaging body in position while the upper part of the positioning/packaging body encloses the light-emitting chip so as to create a reflection cap.

3. The LED light bar as recited in claim 1 wherein the first and second connection blocks include an enclosure groove at the bottom thereof, respectively.

4. The LED light bar as recited in claim 1 wherein the first connection pads, the second connection pads, and the heat-dissipating pads are not covered by a solder mask such that they are located in an exposed state.

5. The LED light bar as recited in claim 1 wherein a heat-conducting isolation layer is formed on the surface of the heat-dissipating pad of the circuit board.

6. An LED light bar having a plurality of LED-packaging arrangements on a circuit board,
    wherein the LED-packaging arrangements include:
        a) a first connection block;
        b) a second connection block;
        c) a third connection block;
        d) a light-emitting chip positioned at the top of the first connection block and via connection wires electrically coupled to the second and third connection blocks;
        e) a positioning/packaging body adapted to enclose the first, second, and third connection blocks in position such that the bottom surfaces of the first, second, and third connection blocks are exposed; and
        f) a transparent packaging body adapted to seal and fix the light- emitting chip and the connection wires in position for an optimal protection, and
    wherein the circuit board includes an isolation carrier plate with circuits at the top thereof, and wherein the created circuits are arranged corresponding to the third connection blocks and the second connection blocks of the LED-packaging arrangements in such a way that a plurality of first connection pads and second connection pads are created, and wherein a plurality of heat-dissipating pads are formed at the bottom of the isolation carrier plate, and wherein a heat-conducting through hole is formed between corresponding ones of the first connection pads and heat-dissipating pads for a thermal connection.

7. The LED light bar as recited in claim 6 wherein the first, second, and third connection blocks are enclosed by the lower part of the positioning/packaging body in position while the upper part of the positioning/packaging body encloses the light-emitting chip so as to create a reflection cap.

8. The LED light bar as recited in claim 6 wherein the first, second, and third connection blocks include an enclosure groove at the bottom thereof, respectively.

9. The LED light bar as recited in claim 6 wherein the first connection pads, the second connection pads, and the heat-dissipating pads are not covered by a solder mask such that they are located in an exposed state.

10. The LED light bar as recited in claim 6 wherein a heat-conducting isolation layer is formed on the surface of each of the heat-dissipating pads of the circuit board.

* * * * *